United States Patent [19]

Wada et al.

[11] Patent Number: 4,751,683

[45] Date of Patent: Jun. 14, 1988

[54] STATIC SEMICONDUCTOR MEMORY DEVICE COMPRISING WORD LINES EACH OPERATING AT THREE DIFFERENT VOLTAGE LEVELS

[75] Inventors: Tomohisa Wada; Hirofumi Shinohara, both of Itami, Japan

[73] Assignee: Mitsubishi Denki Kabushiki Kaisha, Tokyo, Japan

[21] Appl. No.: 771,709

[22] Filed: Sep. 3, 1985

[30] Foreign Application Priority Data

Oct. 22, 1984 [JP] Japan ................... 59-223322

[51] Int. Cl.$^4$ ............................... G11C 8/00
[52] U.S. Cl. ................... 365/230; 365/227; 365/233
[58] Field of Search ............ 365/230, 233, 227, 190, 365/226; 360/189

[56] References Cited

U.S. PATENT DOCUMENTS

| Re. 28,905 | 7/1976 | Hodges | 365/190 |
|---|---|---|---|
| 4,023,148 | 5/1977 | Heuber et al. | 365/227 |
| 4,272,832 | 9/1981 | Ito | 365/189 |
| 4,348,747 | 9/1982 | Takahashi | 365/190 |
| 4,360,903 | 11/1982 | Plachno et al. | 365/222 X |
| 4,446,536 | 1/1984 | Rodgers | 365/230 |
| 4,460,984 | 7/1984 | Knepper | 365/190 |
| 4,536,859 | 8/1985 | Kamuro | 365/190 |

FOREIGN PATENT DOCUMENTS

| 178914 | 4/1986 | European Pat. Off. | |
|---|---|---|---|
| 55-113195 | 9/1980 | Japan | 365/190 |
| 55-160390 | 12/1980 | Japan | 365/190 |
| 56-140586 | 11/1981 | Japan | 365/227 |
| 59-229785 | 12/1984 | Japan | 365/233 |

OTHER PUBLICATIONS

*Electronics*, "4K Static RAMs Give Fast Access" by Advanced Micro Devices, May 13, 1976, pp. 137–138.
"16-K Static RAM Takes New Route to High Speed", by Rahul Sud et al., Electronics, Sep. 11, 1980, pp. 117–123.
"Address-Transistion Detection Speeds Up Byte-Wide Static RAMs" by John Barnes et al., Electronics, Nov. 3, 1983, pp. 142–144.
"A 20ns 64K CMOS SRAM", by Osamu Minato et al., IEEE, ISSCC/Thurs., Feb. 22, 1984, pp. 222–223.

Primary Examiner—Stuart N. Hecker
Assistant Examiner—Alfonso Garcia
Attorney, Agent, or Firm—Lowe, Price, LeBlanc, Becker & Shur

[57] ABSTRACT

A semiconductor memory device in accordance with the present invention operates in response to an address transition detection (ATD) signal for detecting a change in an x address as well as to a write enable signal $\overline{WE}$ to make the signal level on a selected word line vary according to the read mode and the write mode, whereby dissipation of electric power can be reduced.

17 Claims, 5 Drawing Sheets

STATIC SEMICONDUCTOR MEMORY DEVICE COMPRISING WORD LINES EACH OPERATING AT THREE DIFFERENT VOLTAGE LEVELS

BACKGROUND OF THE INVENTION

1. Field of the Invention

The present invention relates to a semiconductor memory device and particularly to a semiconductor memory device in which the potential of a selected word line in a static random access memory (static RAM) is changed according to the read mode and the write mode, whereby power dissipation can be reduced.

2. Description of the Prior Art

FIG. 6 is a schematic view showing a structure of a word line selecting system of a conventional static semiconductor memory device (CMOS static RAM). Referring to FIG. 6, a memory cell 3 comprises four transistors and two resistance elements. More specifically, the memory cell 3 comprises: n-MOS transistors Q3 and Q4, the drains and the gates thereof being cross-connected and the sources thereof being connected to a ground potential GND; an n-MOS transistor Q1, one conduction terminal thereof being connected to the drain of the transistor Q3, the other conduction terminal thereof being connected to a bit line ($\overline{BL}$) 6 and the gate thereof being connected to a word line (WL) 5; and an n-MOS transistor Q2, one conduction terminal thereof being connected to the drain of the transistor Q4, the other conduction terminal thereof being connected to a bit line ($\overline{BL}$) 7 and the gate thereof being connected to the word line (WL) 5. The drains of transistors Q3 and Q4 are connected to the power supply potential or voltage $V_{cc}$ through high resistance elements R1 and R2, respectively. The bit lines 6 and 7 are connected to the supply potential $V_{cc}$ through diode-connected load n-MOS transistors Q10 and Q11, respectively. The word line selecting system comprises x address decoders in two stages. The first x address decoder comprises a z decoder 1 formed by a NOR gate for receiving and decoding some of the x addresses and an inverter 10 for inverting an output signal received from the z decoder 1 to provide the inverted signal. The inverter 10 comprises complementally connected p-MOS transistor Q9 and n-MOS transistor Q8. More specifically, the gates of the transistors Q8 and Q9 are connected with each other to form an input portion of the inverter 10 and the drains of the transistors Q8 and Q9 are connected with each other to form an output portion of the inverter 10. The source of the transistor Q8 is connected to the ground potential GND and the source of the transistor Q9 is connected to the supply potential $V_{cc}$. The output signal WLL of the inverter 10 is applied to the source of a p-MOS transistor Q7 to be described later and the complementary signal $\overline{WLL}$ of the inverter 10 is applied to the gate of the n-MOS transistor Q5, the drain of which is connected to the word line 5.

The second x address decoder comprises an x decoder 2 formed by a NAND gate for receiving and decoding the other x addresses and an inverter 20 for inverting a signal received from the x decoder 2 to provide the inverted signal to the word line 5. The inverter 20 comprises a p-MOS transistor Q7 and an n-MOS transistor Q6 which are complementarily connected. The gates of the transistors Q6 and Q7 are connected with each other to form an input portion of the inverter 20, through which the signal from the x decoder 2 is received. The drains of the transistors Q6 and Q7 are connected with each other to form an output portion of the inverter 20, through which the signal is provided to the word line 5. The source of the transistor Q7 receives the output signal WLL from the inverter 10 and the source of the transistor Q6 is connected to the ground potential GND.

The n-MOS transistor Q5 having the drain connected to the word line 5 is a transistor for pulling down the potential on the word line 5.

Now, the operation of the above described conventional device will be described. Consider the case in which all the x addresses are at the level "H". At this time, since the z decoder 1 and the x decoder 2 are both formed by the NAND gates, a signal at "L" is provided. Consequently, the output signal WLL of the inverter 10 coupled to the z decoder 1 is a signal at "H" with the supply voltage $V_{cc}$ level. On the other hand, the inverter 20 coupled to the x decoder 2 provides a signal at "H" to the word line 5 at this time as the signal WLL is applied to the source of the transistor Q7. At the same time, since the complementary signal $\overline{WLL}$ of the signal WLL is applied to the gate of the pull-down transistor Q5, the transistor Q5 is brought into the OFF-state and the word line selection signal WL on the word line 5 attains the level "H". Thus, the word line is selected.

In case where at least one signal of "L" is included in the x address signal, at least either the z decoder 1 or the x decoder 2 provides a signal of "H". Now consider the case in which the x decoder 1 provides a signal at "H". At this time, the output signal WLL of the inverter 10 becomes "L" and the output signal of the inverter 20 becomes "L" irrespective of the output signal level of the x decoder 2 (the signal WLL being applied to the source of the transistor Q7), and the level of the signal WL on the word line 5 becomes "L" in cooperation with the transistor Q5 brought into the ON-state. On the contrary, in case where the x decoder 2 provides a signal at "H", the inverter 20 provides a signal at "L" irrespective of the output signal level of the z decoder 1 and the signal WL on the word line 5 becomes "L".

The x decoder in a conventional static RAM is thus structured and with such structure, the word line selection signal WL can only take either the supply potential level $V_{cc}$ or the ground potential level GND. In the memory cell 3 connected to a selected word line, when the word line selection signal WL is at the level "H", electric current flows in the below indicated course. When the transistor Q3 is in the ON-state, electric current flows in the following circuit: power supply ($V_{cc}$)→transistor Q10→transistor Q1→transistor Q3→ground (GND). When the transistor Q4 is in the ON-state, electric current flows in the following circuit: power supply ($V_{cc}$)→transistor Q11→transistor Q2→transistor Q4→ground (GND). Thus, electric current flows in a large number of memory cells connected to a selected word line and as a result, the conventional semiconductor memory device involves a disadvantage that the amount of power dissipation is large.

Therefore, an object of the present invention is to provide a semiconductor memory device with reduced power dissipation, by which the above stated disadvantage can be overcome.

SUMMARY OF THE INVENTION

A semiconductor memory device in accordance with the present invention operates in response to an address transition detection (ATD) signal changing according to the change of an address signal as well as to a write enable signal $\overline{WE}$ to adjust variably the signal level on a selected word line according to the read/write operation mode, whereby power dissipation in the device can be reduced.

More specifically stated, the above stated semiconductor memory device generates first and second control signals changing in response to the signal ATD and the signal $\overline{WE}$ and generates a level generation signal TLS changing to the "H" level, the "L" level or the "middle level" depending on the combination of the states of the first and second control signals so that the signal TLS is supplied to the word line. At the same time, based on the first and second control signals, a third control signal is generated and applied to the gate of a pull-down transistor connected to the word line so that the pull-down transistor is turned off at the time of reading/writing operation.

In the prior art, semiconductor memory devices where the ATD signal is used as a reference signal for control are disclosed for example in the following papers: (1) "16K static RAM takes new route to high speed", by Rahul Sud et al., Electronics, Sep. 11, 1980; (2) "Address-transition detection speed up by byte-wide static RAM", by John Barnes et al., Electronics, Nov. 3, 1983; (3) "A 20 ns 64k CMOS SRAM", by Osamu Minato et al., IEEE, ISSCC/THURS., Feb. 23, 1984.

In the paper (1), equilibration and precharge of a bit line are performed in response to a pulse signal based on an ATD signal whereby access of the RAM can be made with high speed.

In the paper (2), equilibration of a bit line and a sense amplifier is performed using a pulse responsive to an ATD signal to operate the RAM with high speed. In the paper (3), a signal generated in response to an ATD signal is used as an input signal to the x decoder to control the level of a word line, whereby power dissipation can be reduced. Although the device in the paper (3) has the same object as in the present invention, the method for accomplishing the object is completely different from the present invention, as seen in the circuit structure etc.

These objects and other objects, features, aspects and advantages of the present invention will become more apparent from the following detailed description of the present invention when taken in conjunction with the accompanying drawings.

DESCRIPTION OF THE PREFERRED EMBODIMENTS

In the following, an embodiment of the present invention will be described with reference to the drawings.

Figure 1:
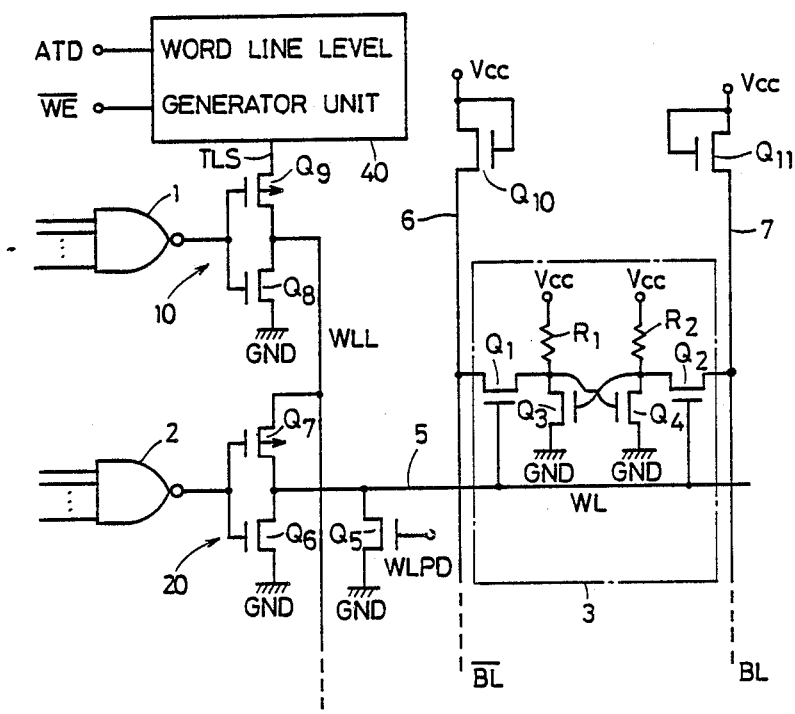
FIG. 1 is a diagram showing a structure of a semiconductor memory device of an embodiment of the present invention.
Figure 6:
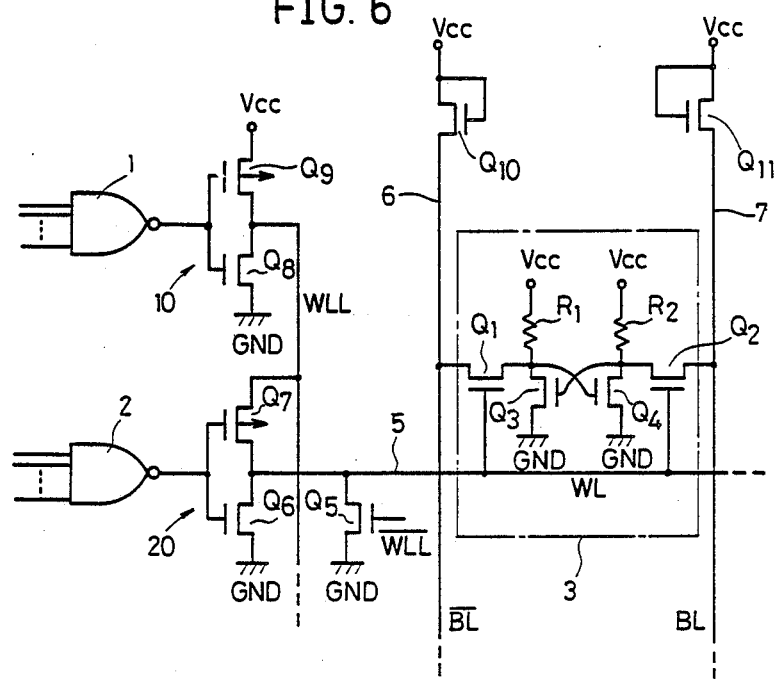
FIG. 6 is a diagram showing a structure of a conventional semiconductor memory device.

FIG. 1 is a schematic diagram of a structure of a semiconductor memory device in accordance with an embodiment of the present invention. Referring to FIG. 1, different from the conventional semiconductor memory device shown in FIG. 6, a word line level generator unit 40 is provided so as to generate a signal TLS having a level changing according to the read mode and the write mode of the semiconductor memory device, upon receipt of a pulse generated in response to the change of an address signal, that is, an ATD signal and a write enable signal $\overline{WE}$. An output signal TLS from the word line level generator unit 40 is applied to the source of the transistor Q9 in the inverter 10. The word line level generator unit 40 also generates a signal WLPD for controlling the operation of the pull-down transistor Q5, the drain of which is connected to the word line 5, so that the signal WLPD is applied to the gate of the transistor Q5.

Figure 2:
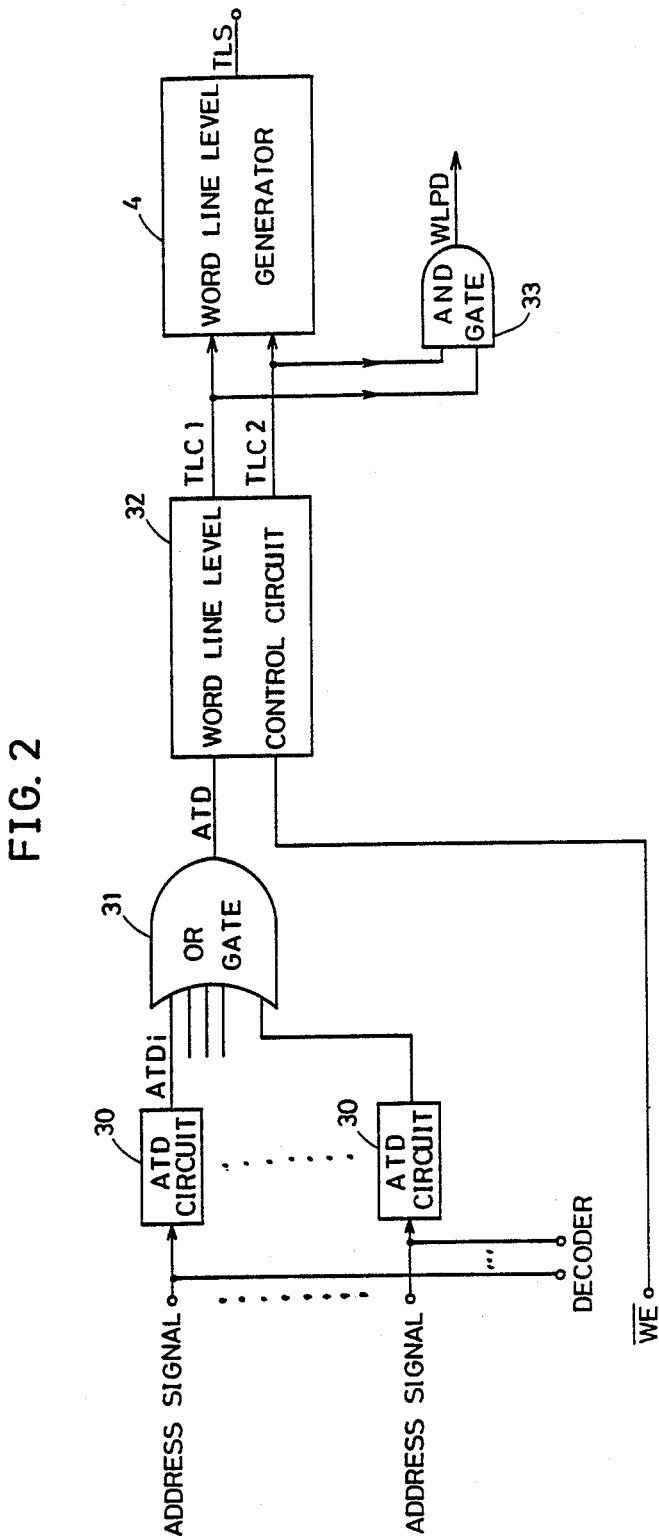
FIG. 2 is a block diagram showing a structure of a word line level generator unit shown in FIG. 1.

FIG. 2 is a block diagram showing a structure of a word line level generator unit. Referring to FIG. 2, an ATD signal generator unit comprises a plurality of address transition detectors 30 each generating a one-shot pulse signal ATDi with the change of an address signal received by the detectors 30 as a trigger and an OR gate 31 for obtaining a logical sum OR of the signals received from the respective address transition detectors 30 to supply the signal ATD to a word line level control circuit 32. The word line level generator unit 40 comprises: a word line level control circuit 32 responsive to the signal ATD and the signal $\overline{WE}$ for generating signals TLC1 and TLC2 changing to "H" or "L" according to the levels of the signals ATD and $\overline{WE}$; an AND gate 33 for obtaining a logical product AND of the signals TLC1 and TLC2 to apply a signal WLPD to the gate of the pull-down transistor Q5; and a word line level generator 4 responsive to the signals TLC1 and TLC2 for generating a signal TLS changing to "H", "L" or "middle level" according to the levels of the signals TLC1 and TLC2 to apply the signal TLS to the source of the transistor Q9 in the inverter 10.

The relation between the input signals ATD and $\overline{WE}$ and the output signals TLC1 and TLC2 of the word line level control circuit 32 is as follows. When the signal $\overline{WE}$ is "H", the signals TLC1 and TLC2 both are "L" during a predetermined period in response to the pulse change of the signal ATD. When the signal ATD is unchanged, the signals TLC1 and TLC2 are both "H".

When the signal $\overline{WE}$ is "L", the signal ATD does not change and at this time, the signal TLC1 is "L" and the signal TLC2 is "H" during the period of the signal $\overline{WE}$ at "L". A concrete circuit for establishing the above described input and output relation could be easily formed by those skilled in the art using logic gates or the like, when a group of the signals $\overline{WE}$, ATD and TLC1 and a group of the signals $\overline{WE}$, ATD and TLC2, for example, are separately taken into consideration.

The relation between the input signals TLC1 and TLC2 and the output signal TLS of the word line level generator 4 is as follows.

When the signals TLC1 and TLC2 are both "L", the signal TLS is "H". When the signals TLC1 and TLC2 are both "H", the signal TLS is "L". When the signal TLC1 is "L" and the signal TLC2 is "H", the signal TLS is at the "middle level" (a level intermediate between "H" and "L", which is sufficient to turn on the transistors Q3 and Q4). The combination of the signal TLC1 at "H" and the signal TLC2 at "L" is forbidden.

Figure 3:
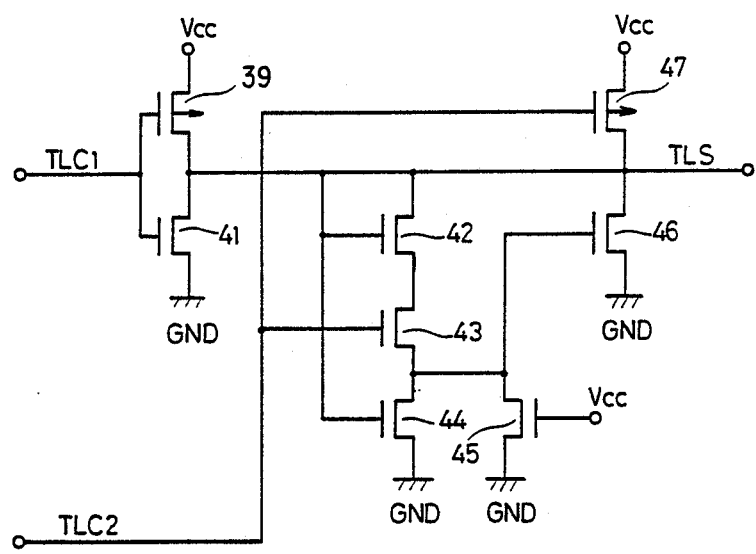
FIG. 3 is a circuit diagram showing an example of a concrete structure of a word line level generator in FIG. 2.

FIG. 3 shows an example of a concrete circuit structure of the word line level generator. Referring to FIG. 3, the word line level generator 4 comprises: an inverter including a p-MOS transistor 39 and an n-MOS transistor 41 for receiving the signal TLC1; an output portion including a p-ch MOS transistor 47 for receiving the signal TLC2 at the gate thereof and an n-MOS transistor 46 having a gate coupled to the ground potential GND through the n-MOS transistor 45; and an output level control portion including n-MOS transistors 42, 43, 44 and 45. The output level control portion is formed as a resistance-division circuit which operates with the signal TLC1 at "L" and the signal TLC2 at "H" to bring the output signal TLS to the "middle level". However, the concrete structure of this resistance-division circuit does not constitute a limiting part of the present invention. In other words, this circuit may be any suitable circuit as far as the above stated relation of the input signals TLC1 and TLC2 and the output signal TLS is established.

Figure 4:
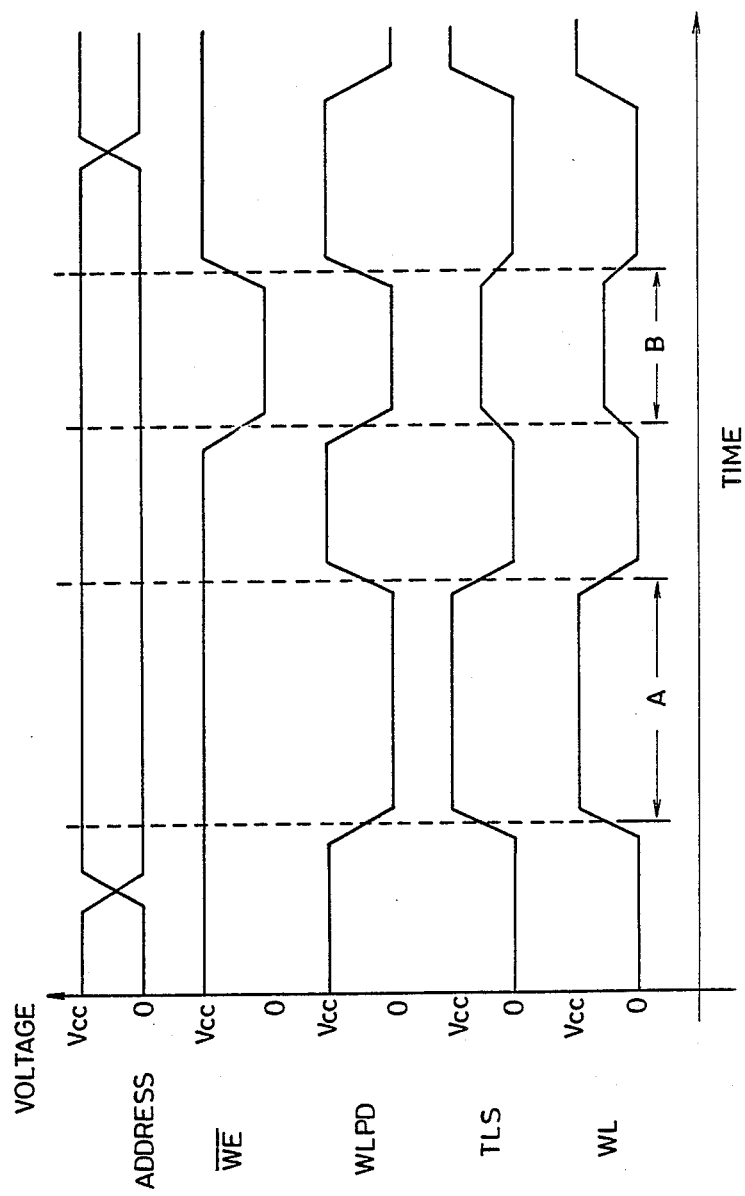
FIG. 4 is a timing chart showing operation timing of a semiconductor memory device in accordance with the present invention

FIG. 4 is a timing chart showing operation timing of the device shown in FIGS. 1 and 2. In the following, the operation of the device of this embodiment will be described with reference to FIGS. 1 to 4.

In operation, according to the change of the address signal, the OR gate 31 generates a one-shot pulse (ATD signal) and applies it to the word line level control circuit 32. The word line level control circuit 32 changes the signals TLC1 and TLC2 both to "L" in response to the change of the signal ATD and the signal $\overline{WE}$ at "H". The word line level generator 4 changes the signal TLS to "H" in response to the signals TLC1 and TLC2 both at "L" and applies the signal TLS at "H" to the source of the transistor Q9. On the other hand, the AND gate 33 applies the signal WLPD at "L" to the gate of the transistor Q5 in response to the signals TLC1 and TLC2 both at "L" so that the transistor Q5 is turned off. As a result, since the "H" level of the signal TLS is the power supply potential level $V_{cc}$, the signal WL on the selected word line 5 attains the level $V_{cc}$, whereby a reading operation can be performed. Thus, the operation in the period A in FIG. 4 is performed. After completion of the reading operation (in the period A in FIG. 4), the signals TLC1 and TLC2 both change to "H". In response to the change, the signal TLS changes to "L", the signal WLPD changes to "H", the transistor Q5 is brought into the ON-state and the signal WL on the word line 5 changes to the GND level. Consequently, the transistors Q1 and Q2 are brought into the OFF-state so that the electric current flowing from the power supply to the memory cell 3 through the bit lines 6 and 7 is cut off. Then, when the signal $\overline{WE}$ changes to "L", the signal TLC1 becomes "L" and the signal TLC2 becomes "H". As a result, the signal TLS changes to the "middle level" and the signal WLPD changes to "L". In consequence, the transistor Q5 is brought into the OFF-state, the signal WL on the selected word line 5 changes to the "middle level" and the transistor Q1 and Q2 are brought into the ON-state, whereby writing operation can be perfomed. Thus, the operation in the period B in FIG. 4 is performed. At this time, the signal level applied to the transistors Q1 and Q2 is lower than that in the conventional device and the electric current flowing in the MOS transistor is proportional to $(V_G - V_{Th})^a$ where $V_G$ is gate voltage, $V_{Th}$ is threshold voltage and $a \approx 1 \sim 2$. As a result, the amount of the electric current flowing from the bit lines 6 and 7 to the memory cell 3 can be decreased to less than ½ of that in the conventional device. After completion of the writing operation (in the period B), the signal $\overline{WE}$ becomes "H" and the signals TLC1 and TLC2 both become "H". Consequently, the signal TLS becomes "H", the signal WLPD becomes "H" and the signal WL on the word line 5 becomes "L". As a result, the electric current flowing in the memory cell 3 can be cut off. Thus, in a semiconductor memory device of this invention, the signal level on a word line can be adjusted variably according to the operation mode and power dissipation can be reduced without making a considerable change in the structure of a conventional decoder.

Although in the foregoing embodiment, x address decoders in two stages are described, the same effect as in the above embodiment can be obtained if an x address decoder in one stage or x address decoders in three stages are provided.

Figure 5:
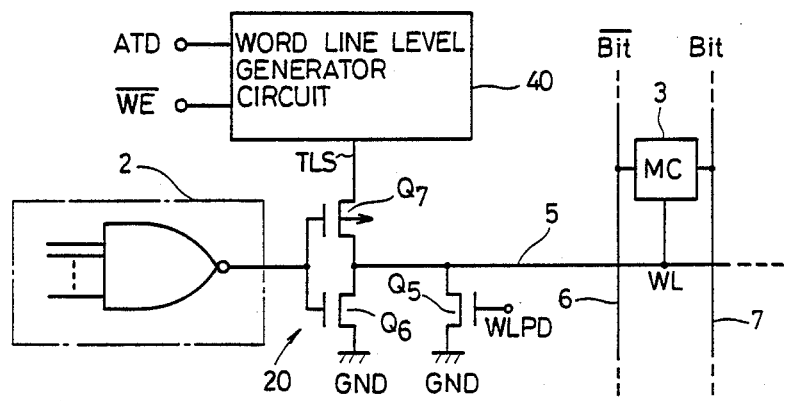
FIG. 5 is a diagram showing a structure of a semiconductor memory device of another embodiment of the present invention.

FIG. 5 shows a structure of a device in the case of an x address in one stage. In FIG. 5, the signal TLS from the word line level generator unit 40 is applied to the source of the transistor Q7 included in the inverter 20 coupled to the x decoder 2.

As described in the foregoing, a semiconductor memory device in accordance with this invention adjusts variably the signal level on a selected word line according to the operation mode, based on the signal ATD and the signal $\overline{WE}$ and thus, power dissipation can be considerably reduced without making a considerable change in the structure of a conventional decoder.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of memory cells connected respectively to a plurality of word lines, operable in a read mode and a write mode according to a write enable signal, said device comprising:
   decoder means (1 and 2) for decoding an applied address signal to select an associated word line,
   word line level generating means (40) responsive to said address signal and said write enable signal for generating a signal at any one of a high level, a low level and an intermediate level between said high level and said low level, said level changing according to the writing and the reading of a selected memory cell,
   said word line level generating means generating said intermediate level signal for the word line when the word line is selected for a write operation, and
   means (10 and 12) provided between said decoder means (1 and 2) and said plurality of word lines for transmitting said signal from said word line level generating means to said selected word line.

2. A semiconductor memory device as set forth in claim 1 wherein said word line level generating means comprises:
   address change detecting means (30 and 31) for detecting a change in the applied address signal,
   control signal generating means (32) for generating first and second control signals changing in response to the signal from said address change detecting means and said write enable signal, and a word line level signal generating circuit (4) responsive to said first and second control signals for generating said signal at any one of said high level, said low level and said intermediate level between said high level and said low level.

3. A semiconductor memory device as set forth in claim 1, wherein
said signal level transmitting means is an inverter provided between said decoder means and said word line, and the signal from said word line level generating means (40) is applied to one input terminal of a transistor of said inverter.

4. A semiconductor memory device as set forth in claim 2, wherein
each of said plurality of word lines is connected with a MOS transistor for pulling down a word line signal level, and a signal as a logical product of said first and second control signals is applied to the gate of said pull-down MOS transistor.

5. A semiconductor memory device as set forth in claim 1, wherein
the signal from said word line level generating means changes to said relatively high level at the time of reading of a selected memory cell.

6. A semiconductor memory device as set forth in claim 1, wherein said semiconductor memory device is a static RAM.

7. A semiconductor memory device as recited in claim 2, wherein said address change detecting means includes a plurality of address transition detection means each connected for detecting transitions in address signals provided by said decoder means,
each of said address transition detection means providing an output signal,
an OR gating means having a plurality of inputs, each input connected to a respective output of one of said address transition detection means, said OR gate means providing an output signal to said control signal generating means.

8. A semiconductor memory device as recited in claim 7 further comprising AND gate means connected to receive said first and second control signals generated by said control signal generating means for providing an output signal for connection to a MOS pull-down transistor for pulling down a word line signal level in response to detection of a logical product of said first and second control signals.

9. In a semiconductor memory device having a plurality of memory cells connected respectively to a plurality of word lines, operable in a read mode and a write mode according to a write enable signal, the improvement comprising:
decoder means (1 and 2) for decoding an applied address signal to select an associated word line,
word line level generating means 40) responsive to said address signal and said write enable signal for generating a signal for selected word lines, said word line level generating means generating said signal at three levels, including a high level, a low level and an intermediate level between said high level and said low level, said signal generated at levels which are different for word lines selected for writing of a selected memory cell and for word lines selected for reading of a selected memory cell,
said word line level generating means generating said intermediate level signal when the word line is selected for a write operation, and means (10 and 20) provided between said decoder means (1 and 2) and said plurality of word lines for transmitting said signal from said word line level generating means to said selected word line.

10. A semiconductor memory device having a plurality of memory cells connected respectively to a plurality of word lines, operable in a read mode and a write mode according to a write enable signal, said device comprising:
decoder means (1 and 2) for decoding an applied address signal to select an associated word line,
word line level generating means (40) responsive to said address signal and said write enable signal for generating a signal for a selected word line, and
means (10 and 20) provided between said decoder means (1 and 2) and said plurality of word lines for transmitting said signal from said word line level generating means to said selected word line,
said word line level generating means comprising potential reducing means for reducing a potential difference between a selected word line and non selected word lines thereby reducing current flow through non selected memory cells connected to a selected word line,
said potential reducing means comprises means for providing three different signal levels to said selected word line including an intermediate level between first and second levels, said intermediate level provided when said word line is selected for a write operation to a selected memory cell.

11. A semiconduotor memory device as recited in claim 10 wherein said means for providing different signal levels is operable for providing different signal levels to said selected word line during a write mode operation than during a read mode operation.

12. A semiconductor memory device as recited in claim 11 wherein said means for providing different signal levels is operable for providing a lower signal level to said selected word line during a write mode operation than during a read mode operation.

13. A semiconductor memory device as recited in claim 11 wherein said potential reducing means is operable for reducing the potential difference between the selected and unselected word lines during a write mode operation relative to a potential difference during a read mode operation.

14. A semiconductor memory device as recited in claim 11 wherein said means for providing different signal levels is operable for providing said first level to a selected word line when said word line is selected for a read operation from a selected memory cell, and for providing said second level to said word line when said word line is not selected.

15. A semiconductor memory device as recited in claim 11 wherein said means for providing different signal levels is operable for providing said first level to a selected word line during a read operation, and for providing said second level to said word line when said read operation is concluded.

16. A semiconductor memory device as recited in claim 15 wherein said means for providing different signal levels is further operable for providing to a selected word line said second level when said write operation is concluded.

17. A semiconductor memory device as recited in claim 6 wherein said semiconductor memory device comprises a RAM chip and said word line signal generating circuit is formed of a single means for generating said intermediate level signal for each of said word lines thereof.

* * * * *